United States Patent
Lee et al.

(10) Patent No.: US 9,318,477 B2
(45) Date of Patent: Apr. 19, 2016

(54) SEMICONDUCTOR DEVICE HAVING DUMMY CELL ARRAY

(71) Applicant: Samsung Electronics Co., Ltd., Suwon-si (KR)

(72) Inventors: Ji-myoung Lee, Yongin-si (KR); Young-soo Song, Incheon (KR); Bo-young Lee, Seoul (KR); Jun-min Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/493,526

(22) Filed: Sep. 23, 2014

(65) Prior Publication Data

US 2015/0091188 A1   Apr. 2, 2015

(30) Foreign Application Priority Data

Sep. 27, 2013   (KR) .......................... 10-2013-0115698

(51) Int. Cl.
   *H01L 27/02*   (2006.01)
   *H01L 21/8238*   (2006.01)
   *G11C 7/14*   (2006.01)

(52) U.S. Cl.
   CPC .... *H01L 27/0207* (2013.01); *H01L 21/823821* (2013.01); *H01L 21/823828* (2013.01); *G11C 7/14* (2013.01)

(58) Field of Classification Search
   CPC ................. H01L 27/0207; H01L 21/823821; H01L 21/823828; G11C 7/14
   USPC ........................................................ 257/774
   See application file for complete search history.

(56) References Cited

U.S. PATENT DOCUMENTS

| 7,211,897 | B2 | 5/2007 | Yamanoue et al. |
| 7,585,710 | B2 | 9/2009 | Park et al. |
| 7,661,078 | B1 | 2/2010 | Noice et al. |
| 7,764,077 | B2 | 7/2010 | Naruta |
| 8,004,084 | B2 | 8/2011 | Eda |
| 2004/0213029 | A1* | 10/2004 | Hirata .................... G11C 17/12 365/104 |
| 2005/0041477 | A1* | 2/2005 | Lee et al. ................. 365/185.29 |
| 2006/0131622 | A1 | 6/2006 | Yamada et al. |
| 2008/0203456 | A1* | 8/2008 | Kim ..................... H01L 27/0207 257/306 |
| 2010/0237420 | A1 | 9/2010 | Jang |
| 2011/0031536 | A1 | 2/2011 | Okamoto et al. |
| 2012/0104544 | A1 | 5/2012 | Kubota |
| 2012/0261824 | A1 | 10/2012 | Koti et al. |
| 2014/0001564 | A1* | 1/2014 | Song ................... G06F 17/5081 257/369 |

FOREIGN PATENT DOCUMENTS

KR   2002011549   2/2002

* cited by examiner

*Primary Examiner* — Howard Weiss
*Assistant Examiner* — Sue Tang
(74) *Attorney, Agent, or Firm* — Onello & Mello, LLP

(57) ABSTRACT

A semiconductor device is disclosed. The semiconductor device includes a plurality of dummy gate lines parallel to each other in a first direction and extending in a second direction that is orthogonal to the first direction; a plurality of first dummy filling patterns between the plurality of dummy gate lines, the first dummy filling patterns parallel to each other in the first direction, and arranged apart from each other in the second direction; a plurality of first dummy vias on the plurality of first dummy filling patterns; and a plurality of first dummy wiring lines connected to the plurality of first dummy vias, the first dummy vias extending in the second direction, and parallel to each other in the first direction.

20 Claims, 14 Drawing Sheets

SEMICONDUCTOR DEVICE HAVING DUMMY CELL ARRAY

CROSS-REFERENCE TO RELATED APPLICATIONS

This application claims the benefit of Korean Patent Application No. 10-2013-0115698, filed on Sep. 27, 2013, in the Korean Intellectual Property Office, the disclosure of which is incorporated herein in its entirety by reference.

BACKGROUND

1. Technical Field

Exemplary embodiments in accordance with principles of inventive concepts relate generally to a semiconductor device, and more particularly, to a semiconductor device having a dummy cell array.

2. Description of Related Art

A semiconductor device may include a cell array required for driving the device, and may further include a dummy cell array. In view of the increasingly high integration of semiconductor devices, a dummy cell array must be precisely designed.

SUMMARY

Embodiments in accordance with principles of inventive concepts include a semiconductor device having a dummy cell array, by which various problems in a semiconductor device fabrication method are solved.

According to an aspect, there is provided a semiconductor device including: a plurality of dummy gate lines parallel to each other in a first direction and extending in a second direction that is orthogonal to the first direction; a plurality of first dummy filling patterns between the plurality of dummy gate lines, the first dummy filling patterns parallel to each other in the first direction, and arranged apart from each other in the second direction; a plurality of first dummy wiring lines on the plurality of first dummy filling patterns; and a plurality of first dummy wiring lines connected to the plurality of first dummy vias, the first dummy vias extending in the second direction, and parallel to each other in the first direction.

In some embodiments, a center line of each of the plurality of first dummy filling patterns extends along the second direction, and aligns with a center line of a corresponding first dummy wiring line of the plurality of first dummy wiring lines so that the plurality of first dummy filling patterns are constructed, arranged, and aligned with the plurality of first dummy wiring lines extending along the second direction.

In some embodiments, the plurality of first dummy vias are arranged at the centers of the plurality of first dummy filling patterns, respectively, and are spaced apart from the plurality of dummy gate lines.

In some embodiments, the semiconductor device further comprises a plurality of dummy gate separation lines that intersect the plurality of dummy gate lines along the first direction and are arranged in parallel to each other along the second direction.

In some embodiments, the plurality of first dummy filling patterns are arranged within a perimeters of, and at center portions of, the dummy gate separation lines, and wherein the perimeters of the dummy gate separation lines are between the first dummy filling patterns and the dummy gate lines such that the first dummy filling patterns are not connected to the plurality of dummy gate lines.

In some embodiments, the semiconductor device further comprises a plurality of dummy active patterns crossing the plurality of dummy gate lines along the first direction and arranged in parallel to each other and apart from the plurality of first dummy filling patterns along the second direction.

In some embodiments, a pitch of the plurality of first dummy filling patterns along the second direction is the same as a pitch of the plurality of dummy active patterns.

In some embodiments, a plurality of second dummy filling patterns are arranged between the plurality of dummy gate lines in the plurality of dummy active patterns.

In some embodiments, each of the plurality of first dummy wiring lines is along the second direction and formed as a plurality of first dummy wiring patterns.

In some embodiments, each of the plurality of first dummy wiring patterns is connected to a plurality of first dummy vias along the second direction.

In some embodiments, the semiconductor device further comprises a plurality of second dummy vias arranged on the plurality of first dummy wiring lines; and a plurality of second dummy wiring lines are connected to the plurality of second dummy vias, extend along the first direction, and are arranged in parallel to each other along the second direction.

In some embodiments, each of the plurality of second dummy wiring lines is along the first direction and formed as a plurality of second dummy wiring patterns, and each of the plurality of second dummy wiring patterns is connected to a plurality of second dummy vias.

In some embodiments, each of the plurality of first dummy wiring lines is along the second direction and formed as a plurality of first dummy wiring patterns, and a width of the plurality of second dummy wiring patterns along the first direction is about n times of a width of the plurality of first dummy wiring patterns (n is a natural number).

According to another aspect of the inventive concept, there is provided a semiconductor device comprising a plurality of dummy cells. Each dummy cell comprises a plurality of dummy gate lines parallel to each other in a first direction and extending in a second direction that is orthogonal to the first direction; a plurality of dummy gate separation lines intersecting the plurality of dummy gate lines along the first direction and arranged in parallel to each other along the second direction; a plurality of dummy filling patterns between at least one of the plurality of dummy gate lines and arranged apart from each other along the first direction or the second direction; a plurality of dummy vias on the plurality of dummy filling patterns; and a plurality of dummy wiring lines connected to the plurality of dummy vias on the plurality of dummy filling patterns, along the second direction to include a plurality of dummy wiring patterns, and arranged in parallel to each other along the first direction.

In some embodiments, pitches of the plurality of dummy wiring patterns along the first direction and the second direction are about 1/n and n times those of the dummy cell (n is a natural number), respectively.

According to another aspect of the inventive concept, there is provided a dummy cell of a semiconductor device, comprising a plurality of dummy gate lines parallel to each other in a first direction and extending in a second direction that is orthogonal to the first direction; a first interlayer insulating pattern that insulates the dummy gate lines from each other; a first dummy filling pattern between the dummy gate lines, the first dummy filling pattern formed in the first interlayer insulating pattern; a second interlayer insulating layer on the first interlayer insulating layer; a dummy via extending through and insulated by a second interlayer insulating layer; and a dummy wiring line on the first dummy via, the dummy wiring line and the dummy via aligned with each other along the second direction.

In some embodiments, the dummy cell further comprises dummy gate separation lines intersecting the plurality of dummy gate lines along the first direction and arranged in parallel to each other along the second direction.

In some embodiments, a center line of the first dummy filling pattern extends along the second direction, and aligns with a center line of the dummy wiring line.

In some embodiments, the dummy cell further comprises a dummy active pattern crossing the plurality of dummy gate lines along the first direction and apart from the first dummy filling pattern along the second direction.

In some embodiments, a second dummy filling pattern is between the plurality of dummy gate lines in the dummy active pattern.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
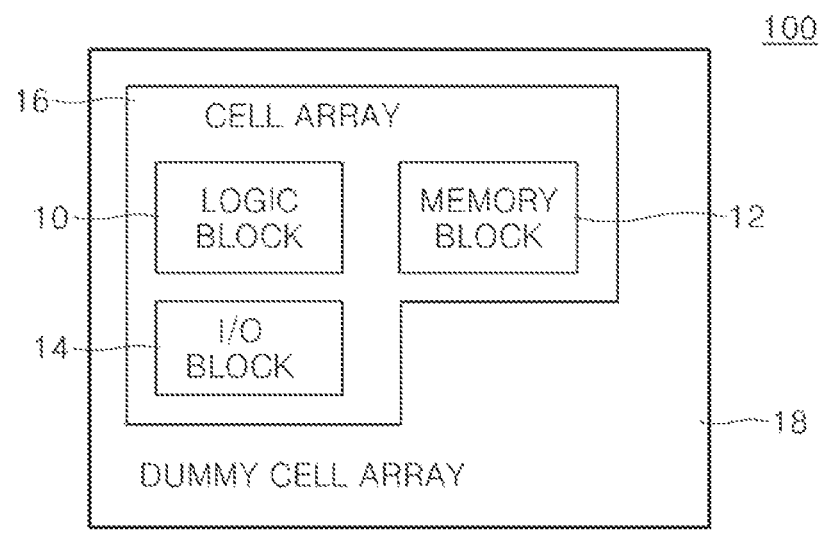
FIG. 1 is a block diagram of a semiconductor device, according to an embodiment of the inventive concept.

Exemplary embodiments of the inventive concept will now be described in detail with reference to the accompanying drawings. The embodiments are provided to describe the inventive concept more fully to those of ordinary skill in the art. The embodiments may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art.

In the description below, when it is described that a certain component is connected to another component, the certain component may be directly connected to another component, or a third component may be interposed therebetween. Similarly, when it is described that a certain component is above another component, the certain component may be directly above another component, or a third component may be interposed therebetween. In the drawings, the structures or sizes of components are exaggerated for convenience and clarity of description, and parts irrelevant to the description are omitted. Like reference numerals in the drawings denote like elements.

All terms used herein including technical or scientific terms have the same meaning as those generally understood by those of ordinary skill in the art unless they are defined differently. It should be understood that terms generally used, which are defined in a dictionary, have the same meaning as in context of related technology, and the terms are not understood as ideal or excessively formal meaning unless they are clearly defined in the application. The terminology used herein is for the purpose of describing the inventive concept only and is not intended to be limiting of the meaning or the scope of the inventive concept as defined by the appended claims.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a semiconductor device 100, according to an embodiment of the inventive concept.

In detail, the semiconductor device 100 may be divided into a cell array 16 and a dummy cell array 18. The cell array 16 may include a logic block 10, a memory block 12, and an input/output (I/O) block 14, and the like. The cell array 16 performs device driving. The dummy cell array 18 is located at a separate part of the semiconductor device 100 than the cell array 16.

The memory block 12 may be a block at which one or more memory devices in charge of a memory function are formed. The logic block 10 may include logic circuit devices required for functions for the semiconductor device 100, e.g., a function required for a memory controller. The I/O block 14 may be a block in which one or more I/O devices in charge of an I/O function required for the logic block 10 and the memory block 12, and the like are formed. The cell array 16 is only illustrative and is not limited thereto.

The dummy cell array 18 may include a plurality of dummy cells. As described above, the dummy cell array 18 may refer to the whole portion of the device 100 except for the cell array 16. The dummy cell array 18 may correspond to a portion of a substrate except for a portion in which the cell array 16 is formed when the semiconductor device 100 is fabricated on the substrate.

Components formed at the dummy cell array 18 may be similar to or the same as components formed in the cell array 16. However, the components formed in the dummy cell array 18 are not connected to a gate line, and may float without a connection to a diffusion region or a well region (or an active region) on the substrate. Therefore, no electrical connection exists between the cell array 16 and the dummy cell array 18.

Although the dummy cell array 18 is clearly distinguished from the cell array 16 in FIG. 1, the dummy cell array 18 and the cell array 16 on the substrate, on which the semiconductor device 100 is formed, may not be clearly distinguished from each other and may be mixed.

Along with the quick progression in the high integration of semiconductor devices, significant time and expense may be incurred for a layout design of the semiconductor device 100, in particular, the cell array 16. Thus, a standard cell-based layout design method may be used as one of the techniques for saving the time and expenses. The standard cell-based layout design method may reduce a time taken for a layout design by designing repeatedly used devices in advance, such as an OR gate, an AND gate, and the like, as standard cells, then storing the standard cells in a computer system, and arranging and wiring the standard cells at desired points in the layout design. Standard cells may include but not be limited to basic cells, such as AND, OR, NOR, INVERTER, and the like, complex cells, such as OR/AND/INVERTER (OAI), AND/OR/INVERTER (AOI), and the like, and storage elements, such as a simple master-slave flip-flop, a latch, and the like.

A standard cell method is a method of designing a dedicated large scale integration (LSI) circuit to meet a particular user or customer demand by preparing logic circuit blocks or cells having various functions in advance, and voluntarily combining these cells. The cells may be designed and verified and registered in a computer system in advance. Logic design, arrangement, wiring, and the like may be carried out by combining registered cells by using computer aided design (CAD).

In more detail, when an LSI circuit is designed or manufactured, if a certain scale of standardized logic circuit blocks or standard cells are already stored in a library, the whole circuit may be designed by retrieving logic circuit blocks suitable for a present design purpose from the library. The retrieved logic circuit blocks may be arranged on a chip as a plurality of cells, and optimally wired in a wiring space between the cells so that a wiring length is the shortest. The more types of cells stored in the library, the greater the flexibility of a design, and the higher the possibility in an optimal design of a chip.

In the semiconductor device 100, each of the blocks, namely, the logic block 10, the memory block 12, and the I/O block 14, in the cell array 16 may include a plurality of fin-shaped field effect transistors (FinFETs), and various semiconductor devices may be formed based on the FinFETs. As a reference, when a planar structure is changed to a FinFET structure, a layout of an active region in a device area is changed. For example, in the planar structure, active regions may be separated from each other according to the type, layout, or other feature of the semiconductor devices. However, in a FinFET structure, active regions may be connected as one body in one direction, e.g., in a direction where a fin extends. In this case, the active regions may be separated from each other in a direction where a gate line extends.

In the semiconductor device 100, active regions in the cell array 16 may also be arranged according to a FinFET structure. In addition, integrated circuits formed in the cell array 16 may be designed by a standard cell method.

The dummy cell array 18 may correspond to an area about the cell array 16 and may be an additional area that assists with the uniformity and enhancement of the performance of active devices (not shown) in the cell array 16 by allowing the uniform process conditions to be maintained for the whole wafer or substrate when a process on the active devices arranged in the cell array 16 is performed. Because the dummy cell array 18 is electrically separated from the active devices arranged in the cell array 16, the dummy cell array 18 may not directly influence the functions of the active devices. For example, the dummy cell array 18 may contribute to the uniformity of the cell array 16, and assists with functional enhancements at a front end of line (FEOL) process.

Examples related to functions of the dummy cell array 18 will now be described.

A chemical mechanical polishing (CMP) process may be performed on a wafer or a substrate to realize a globally planarized surface. However, when circuit patterns, such as shallow trench isolation (STI) pitches or metal lines, are not uniformly arranged on the wafer or the substrate, the planarization effect by the CMP process may be reduced or degraded. Accordingly, to improve an effect of the CMP process, dummy patterns may be arranged around a device area.

In addition, even in a general etching process for patterning, dummy patterns may be formed around the device area similarly to the CMP process, and accordingly, uniform patterns may be implemented in the cell array 16 by maintaining a uniform etching characteristic over the whole cell array 16.

In a wafer or substrate process, a thermal annealing process may be performed in various stages. For example, after an ion implant process, rapid thermal annealing (RTA) may be performed to reduce defects and activate doping ions. However, when the whole wafer or substrate is not globally uniform, a thermal annealing effect may vary at each location on the wafer or substrate, and accordingly, electrical characteristics of active devices may vary at their corresponding locations.

For example, when a thermal annealing temperature is lower or higher than a temperature at a specific location, a threshold voltage or a saturation current of an FET may deviate from a predefined specification. Thus, dummy patterns may be formed about the cell array 16 to exhibit a uniform thermal annealing effect by improving the uniformity of the wafer or substrate.

The dummy patterns used in the CMP, etching, or RTA process described above may be formed around the device area and may not be electrically connected to circuits in the cell array 16. Accordingly, the dummy patterns may not perform a direct electrical function on the circuits.

In the semiconductor device 100 shown in FIG. 1, the cell array 16 protrudes to the right and is surrounded by the dummy cell array 18. However, the structure of the semiconductor device 100 of the present embodiment is not limited thereto. That is, the cell array 16 and the dummy cell array 18 may be constructed and arranged having various structures according to electronic devices to be implemented. For example, the cell array 16 may be divided into two parts, and the dummy cell array 18 may be arranged between the two cell arrays 16 and surround the outer portion of the two cell arrays 16.

In the semiconductor device 100, the dummy cell array 18 may include dummy patterns having similar shapes and pattern density to patterns of integrated circuits arranged in the cell array 16. In more detail, in the semiconductor device 100, integrated circuits may be designed and arranged in the cell array 16 by a cell method based on the FinFET structure. In addition, the dummy cell array 18 may include dummy patterns designed and arranged in a standard cell method by using a dummy unit cell corresponding to a standard cell, and the dummy patterns may have substantially the same shapes and pattern density as the patterns of the integrated circuits in the cell array 16.

Figure 2:
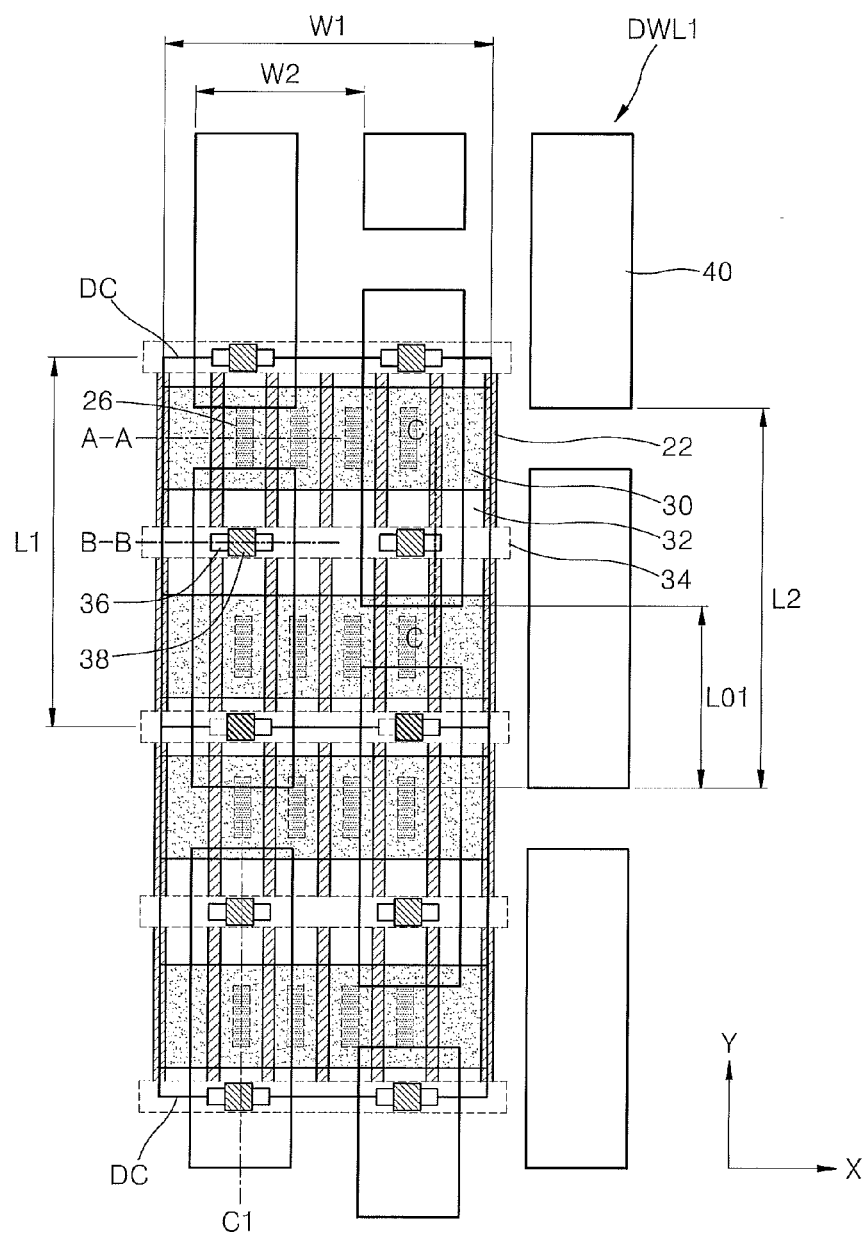
FIG. 2 is a layout diagram of elements of a dummy cell array in a semiconductor device, according to an embodiment of the inventive concept.
Figure 3:
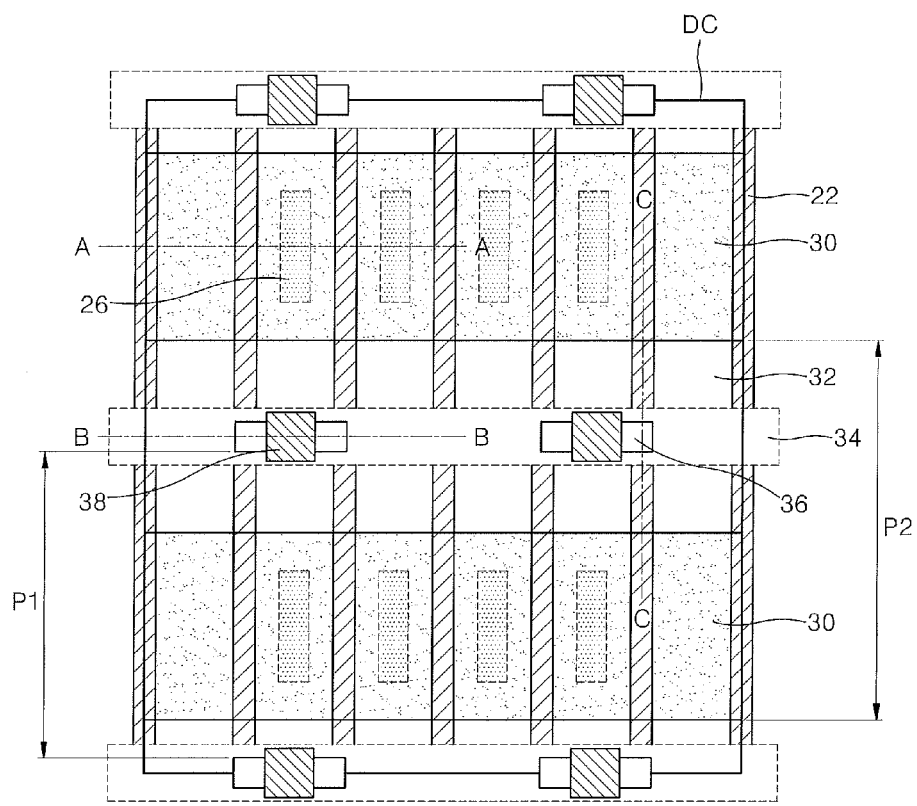
FIG. 3 is a layout diagram of elements of one dummy cell of FIG. 2.

FIG. 2 is a layout diagram of elements of a dummy cell array in a semiconductor device, according to an embodiment of the inventive concept. FIG. 3 is a layout diagram of elements of one dummy cell of FIG. 2.

In detail, the dummy cell array comprises an array of a plurality of dummy cells (DCs), and FIG. 2 shows main elements of two DCs for convenience of description. FIG. 3 is a magnified diagram of one DC of FIG. 2. First dummy wiring lines (DWL1s) 40 are not shown in FIG. 3 for convenience of description.

One DC may include a plurality of dummy gate lines 22, a plurality of first dummy filling patterns 36, a plurality of second dummy filling patterns 26, a plurality of dummy active patterns 30, a plurality of first dummy vias 38, and the DWL1 40. Components formed in the DC may improve the pattern uniformity or an etching process margin when the semiconductor device is fabricated. The term "dummy" used with respect to the DC may indicate that each component is not connected to a gate line or a wiring line required for a device operation and is floated without a connection with a diffusion region or a well region (or an active region) on a substrate.

The plurality of dummy gate lines 22 may be arranged in parallel to each other along a first direction, e.g., an X-axis direction, and extend along a second direction, e.g., a Y-axis direction, that is orthogonal to the first direction. The plurality of dummy gate lines 22 may be formed on the substrate. The plurality of dummy gate lines 22 may be arranged in a same or similar manner as gate lines formed in an active cell.

The plurality of first dummy filling patterns 36 may be arranged in parallel to each other along the first direction and apart from each other along the second direction, and may be formed between the plurality of dummy gate lines 22. The plurality of first dummy filling patterns 36 may include dummy contact patterns. The plurality of first dummy filling patterns 36 may be formed to be aligned in the second direction between the plurality of dummy gate lines 22. The plurality of first dummy filling patterns 36 may not be connected to the plurality of dummy gate lines 22.

The plurality of first dummy vias 38 may be arranged on the plurality of first dummy filling patterns 36, respectively. In correspondence with the plurality of first dummy vias 38, one or more vias may be formed on a cell, i.e., an active cell. The plurality of first dummy vias 38 may be formed at locations where the plurality of first dummy vias 38 are aligned with the subsequently formed plurality of DWL1s 40. The plurality of first dummy vias 38 may be formed in an interlayer insulating layer when the semiconductor device is fabricated.

The interlayer insulating layer may include an insulating material having a low permittivity to reduce a parasitic capacitance along with the integration of semiconductor devices. Since the insulating material having a low permittivity may be a porous material, a mechanical characteristic thereof is very weak. Thus, when the plurality of first dummy vias 38 are formed in the interlayer insulating layer, a mechanical characteristic of the interlayer insulating layer may be improved. When the plurality of first dummy vias 38 are constructed and arranged in the DC, an etching process may be performed when a via-hole is formed to form a cell (i.e., an active cell) and the DC.

Since the plurality of first dummy vias 38 are respectively formed on the plurality of first dummy filling patterns 36, the plurality of first dummy vias 38 may be arranged in parallel to each other along the first direction and be positioned apart from each other along the second direction, as well as the plurality of first dummy filling patterns 36. The plurality of first dummy vias 38 may be respectively arranged on the centers of the plurality of first dummy filling patterns 36 and formed apart from the plurality of dummy gate lines 22. The plurality of first dummy vias 38 may be connected to the plurality of DWL1s 40, respectively. The plurality of first dummy vias 38 may include via contact patterns for connecting the first dummy filling patterns 36 to the DWL1s 40.

The DWL1s 40 are connected to the plurality of first dummy vias 38, respectively, which in turn are positioned on the plurality of first dummy filling patterns 36 extending along the second direction, and arranged in parallel to each other along the first direction. The arrangement of the plurality of DWL1s 40 may be the same as first wiring lines formed in a cell, i.e., an active cell. As described above, the DWL1s 40 may be connected to the first dummy filling patterns 36 through the plurality of first dummy vias 38.

The DWL1s 40 may be aligned with the first dummy vias 38 arranged in the second direction. A center line C1 of the plurality of DWL1s 40 along the second direction may correspond to a center line C1 of the plurality of first dummy filling patterns 36 along the second direction. In other words, the center line C1 of the plurality of first dummy filling patterns 36 along the second direction may match, or align with, the center line C1 of the plurality of DWL1s 40.

The plurality of first dummy filling patterns 36 may be arranged to be aligned with the plurality of DWL1s 40 along the second direction. The plurality of DWL1s 40 and the plurality of first dummy vias 38 may not be connected to the plurality of dummy gate lines 22, and may float without a connection with the diffusion region or the well region (or the active region) on the substrate.

The plurality of DWL1s 40 may be cut along the second direction and formed as a plurality of first dummy wiring patterns 40. One first dummy wiring pattern 40 may be connected to a plurality of first dummy vias 38 along the second direction.

The plurality of first dummy wiring patterns 40, formerly DWL1s 40, may not be aligned along the first direction, as shown in FIG. 2. In FIG. 2, an offset in the second direction of the plurality of first dummy wiring patterns 40 forming the DWL1s 40 arranged in the first direction is indicated by a offset indicator LO1. As described below, if the offset LO1 is zero (0), the plurality of first dummy wiring patterns 40 may be arranged by being aligned along the first direction. The offset LO1 may be adjusted, for example, according to circumstances related to design, configuration, and so on.

Referring again to FIG. 2, a pitch W2 in the first direction of the plurality of first dummy wiring patterns 40 may be implemented as about 1/n times a width W1 of the DC (n is a natural number). For example, the pitch W2 in the first direction of the plurality of first dummy wiring patterns 40 may be implemented to be about ½ times the width W1 of the DC. A pitch L2 in the second direction of the plurality of first dummy wiring patterns 40 may be about n times a length L1 of the DC (n is a natural number). For example, the pitch L2 in the second direction of the plurality of first dummy wiring patterns 40 may be about one time, or the same as, the length L1 of the DC.

The DC may further include a plurality of dummy gate separation lines 34 cutting the plurality of dummy gate lines 22 along the first direction and arranged in parallel to each other along the second direction. The plurality of dummy gate lines 22 may be selectively formed according to circumstances related to design, configuration, and so on. The plurality of first dummy filling patterns 36 may be arranged inside the plurality of dummy gate separation lines 34. The plurality of first dummy filling patterns 36 may be arranged in the center regions of the plurality of dummy gate separation lines 34 unconnected to the plurality of dummy gate lines 22.

The DC may further include a plurality of dummy active patterns 30 that cross the plurality of dummy gate lines 22 along the first direction and are arranged in parallel to each other along the second direction and apart from the plurality of first dummy filling patterns 36. The plurality of dummy active patterns 30 may be formed to correspond with an active pattern formed on the cell, i.e., the active cell.

A portion excluding the plurality of dummy active patterns 30 may include a dummy inactive pattern 32. The plurality of second dummy filling patterns 26 may be arranged between the plurality of dummy gate lines 22 in the plurality of dummy active patterns 30. The plurality of second dummy filling patterns 26 may be dummy contact patterns. According to an embodiment of the inventive concept, to easily arrange the plurality of first dummy vias 38, a pitch P1 of the plurality of first dummy filling patterns 36 described above may be the same as or similar to a pitch P2 of the plurality of dummy active patterns 30 along the second direction.

As described above, by forming the DC according to the inventive concept, the various problems in a semiconductor device fabrication method, e.g., the pattern uniformity, an etching process margin, a mechanical characteristic decrease of the interlayer insulating layer, and the like, in addition to the function of the dummy cell array described above may be addressed.

Figure 4:
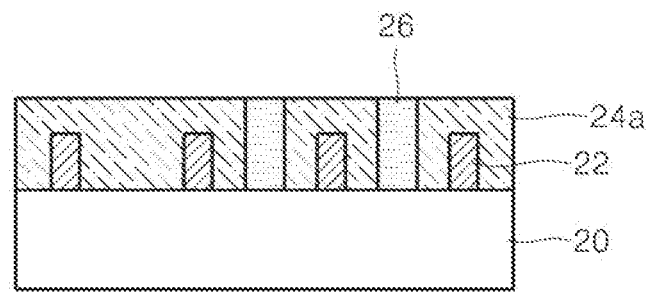
FIGS. 4 to 6 are cross-sectional views of elements of a dummy cell along lines A-A, B-B, and C-C of FIGS. 2 and 3, respectively.
Figure 5:
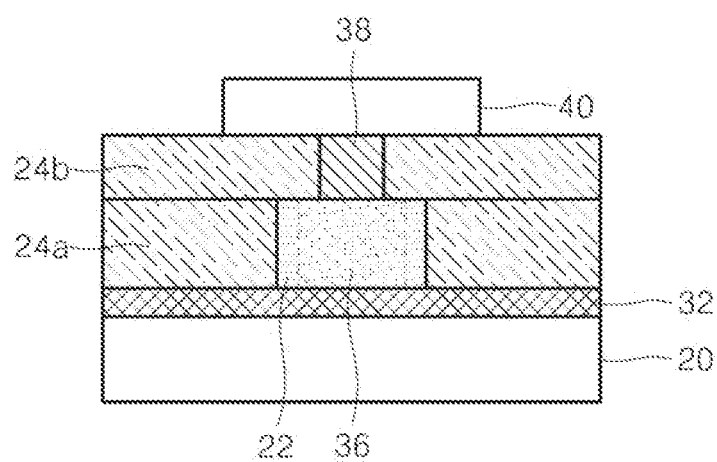
Figure 6:
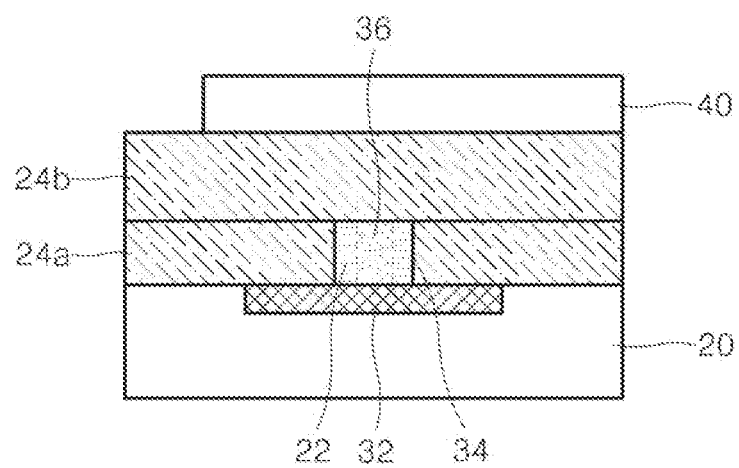
Figure 7:
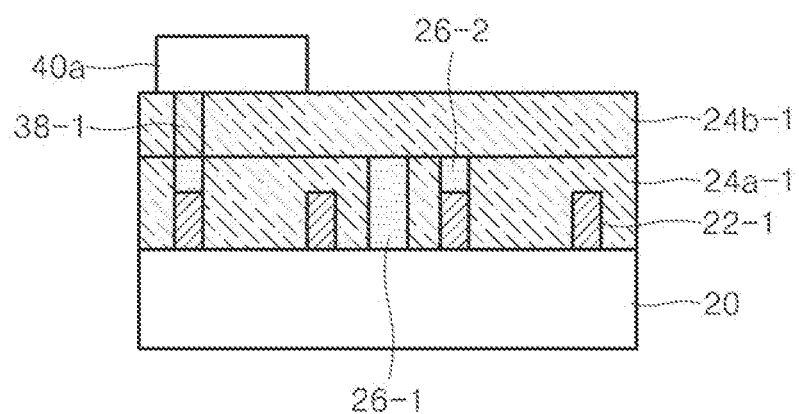
FIG. 7 is a cross-sectional view of elements of a cell.

FIGS. 4 to 6 are cross-sectional views of main elements of a DC along lines A-A, B-B, and C-C of FIGS. 2 and 3, respectively. FIG. 7 is a cross-sectional view of main parts of a cell for a comparison with FIGS. 4 to 6.

In detail, a dummy active pattern (refer to 30 of FIGS. 2 and 3) and a dummy inactive pattern 32 may be formed on a substrate 20, e.g., a silicon substrate. In FIGS. 4 to 6, the dummy active pattern may be a substrate portion except for the dummy inactive pattern 32. A plurality of dummy gate lines 22 may be formed apart from each other on the substrate 20. A plurality of gate lines 22-1 may also be formed apart from each other in a cell, i.e., an active cell, as shown in FIG. 7.

According to some circumstances, a dummy gate separation line 34 cutting, or intersecting, the plurality of dummy gate lines 22 may be formed. In other cases, the dummy gate separation line 34 may not be formed. In the DC, a first interlayer insulating layer 24a may be formed on the substrate 20 to insulate the plurality of dummy gate lines 22 from each other. As shown in FIG. 7, a first interlayer insulating layer 24a-1 may insulate the plurality of gate lines 22-1 of the cell from each other.

A first dummy filling pattern 36 is formed inside the dummy gate separation line 34 in the first interlayer insulating layer 24a. In addition, a second dummy filling pattern 26 is formed on the substrate 20 in the first interlayer insulating layer 24a. As shown in FIG. 7, a first contact pattern 26-1 may be formed on the substrate 20 and extend through the first interlayer insulating layer 24a-1 of the cell. A second contact pattern 26-2 may extend through the first interlayer insulating layer 24a-1 to a gate line 22-1. The first dummy filling pattern 36 of the DC may be formed with a pattern density that is similar to that of the second contact pattern 26-2 of the cell. The second dummy filling pattern 26 of the DC may be formed with a pattern density that is similar to that of the first contact pattern 26-1 of the cell.

In the DC, as shown in FIG. 5, a first dummy via 38 extending through and insulated by a second interlayer insulating layer 24b may be formed on the first interlayer insulating layer 24a in which the first dummy filling pattern 36 and the second dummy filling pattern 26 are formed. As shown in FIG. 7, a first via 38-1 extending through and insulated by a second interlayer insulating layer 24b-1 may be formed on the first interlayer insulating layer 24a-1 in which the first contact pattern 26-1 and the second contact pattern 26-2 are formed. Pattern densities of the first dummy via 38 and the first via 38-1 may be similar to each other.

In the DC, a DWL1 40 may be formed on the first dummy via 38. As shown in FIG. 7, a first wiring line 40a may be formed on the first via 38-1 in the cell.

As described above, in a semiconductor device according to the inventive concept, when each component of a cell is formed, a similar component is also formed in a DC. According to the inventive concept, an etching process may be easily performed when a via of a cell and a DC and a via-hole for forming a dummy are formed. The cell may not be affected by the alignment and arrangement of a plurality of DWL1s on a plurality of first dummy vias in the DC and floating the plurality of DWL1s from the cell.

Figure 8:
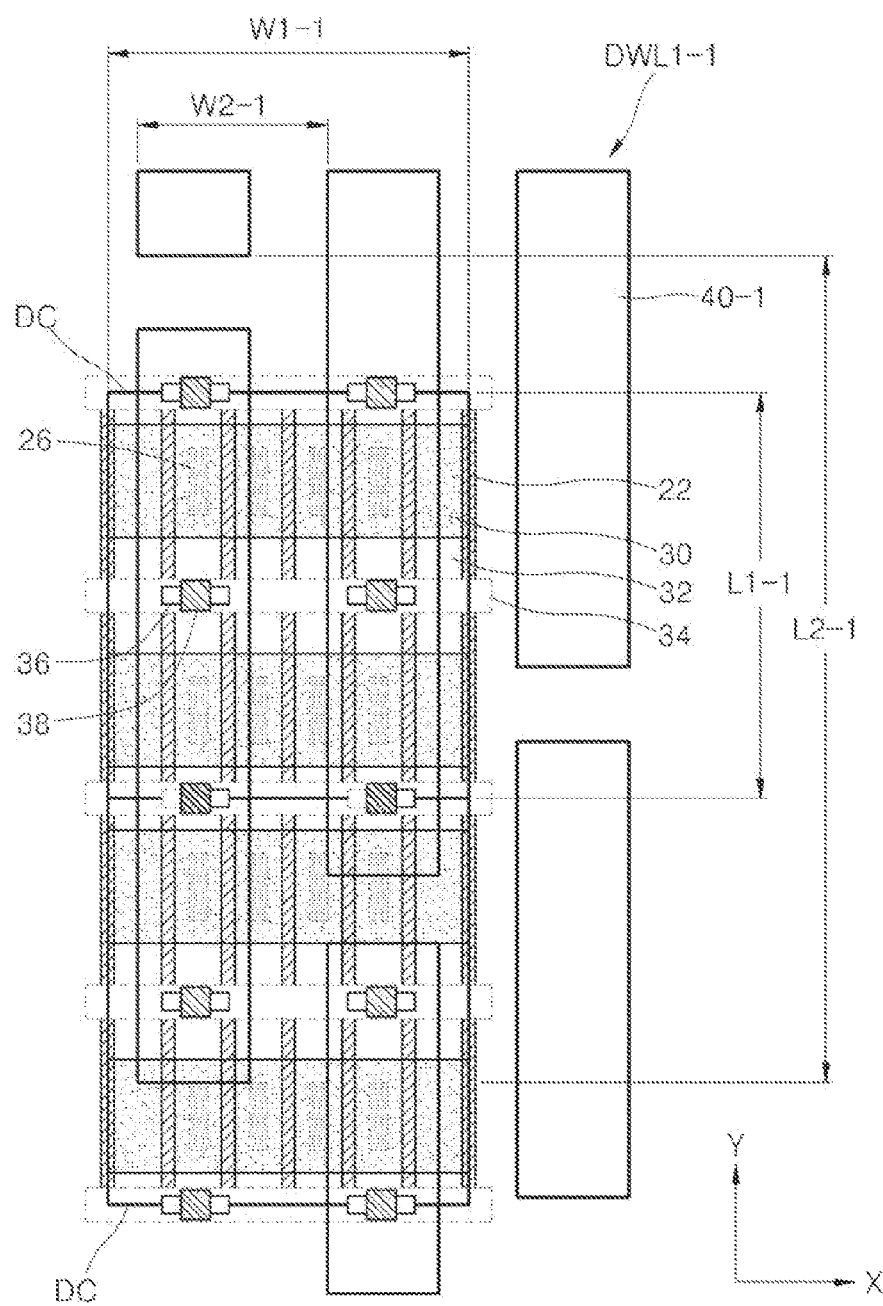
FIG. 8 is a layout diagram of elements of a dummy cell array in a semiconductor device, according to another embodiment of the inventive concept.

FIG. 8 is a layout diagram of elements of a dummy cell array in a semiconductor device, according to another embodiment of the inventive concept.

In detail, the dummy cell array of FIG. 8 may have the same configuration and effects as the dummy cell array of FIG. 2, except for an arrangement of a plurality of first dummy wiring patterns 40-1 forming a plurality of first dummy wiring lines (DWL1-1s).

Compared with the plurality of DWL1s 40 of FIG. 2, each DWL1-1 40-1 is formed on four first dummy vias 38. The plurality of first dummy wiring patterns 40-1 may be arranged without being aligned along the first direction.

A pitch W2-1 extending in the first direction of the plurality of first dummy wiring patterns 40-1 forming the plurality of DWL1-1s 40-1 may be implemented as about ½ times a width W1-1 of the DC. A pitch L2-1 in the second direction thereof may be about two times a length L1-1 of the DC.

As described above, each DWL1-1 40-1 may be formed to cover a plurality of first dummy vias 38, e.g., four first dummy vias 38. The plurality of first dummy wiring patterns 40-1 may be arranged without being aligned along the first direction.

Figure 9:
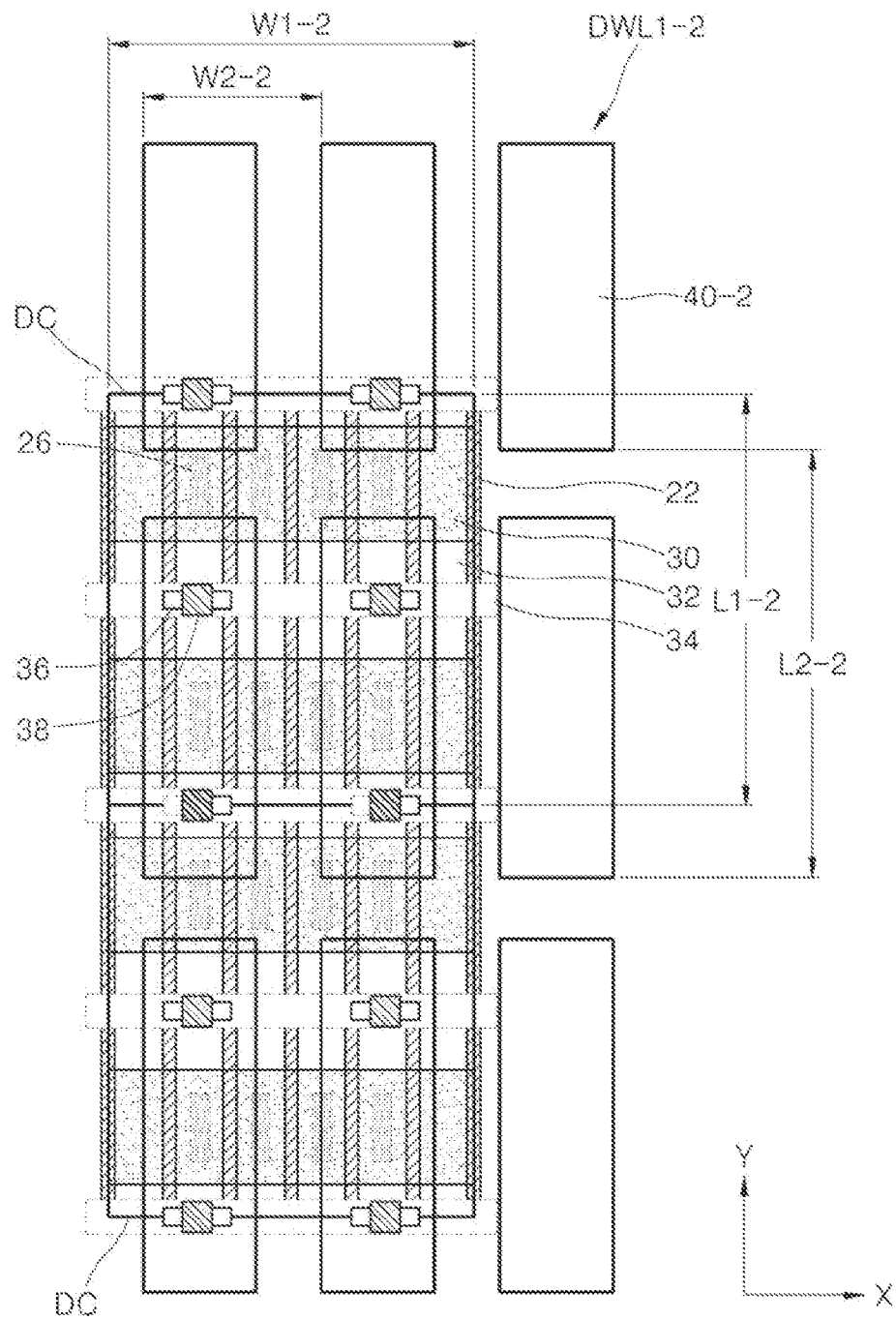
FIG. 9 is a layout diagram of elements of a dummy cell array in a semiconductor device, according to another embodiment of the inventive concept.

FIG. 9 is a layout diagram of elements of a dummy cell array in a semiconductor device, according to another embodiment of the inventive concept.

In detail, the dummy cell array of FIG. 9 may have the same configuration and effects as the dummy cell array of FIG. 2 except for an arrangement of a plurality of first dummy wiring patterns 40-2 forming a plurality of first dummy wiring lines (DWL1-2s).

Compared with the plurality of DWL1s 40 of FIG. 2, the plurality of DWL1-2s 40-2 have no offset LO1 Accordingly, the plurality of first dummy wiring patterns 40-2 may be arranged by being aligned along the first direction.

A pitch W2-2 in the first direction of the plurality of first dummy wiring patterns 40-2 forming the plurality of DWL1-2s 40-2 may be implemented as about ½ times a width W1-2 of the DC. A pitch L2-2 in the second direction thereof may be about one time a length L1-2 of the DC. As described above, each DWL1-2 40-2 may cover a plurality of first dummy vias 38, e.g., two first dummy vias 38. The first dummy wiring patterns 40-2 may be aligned along the first direction.

Figure 10:
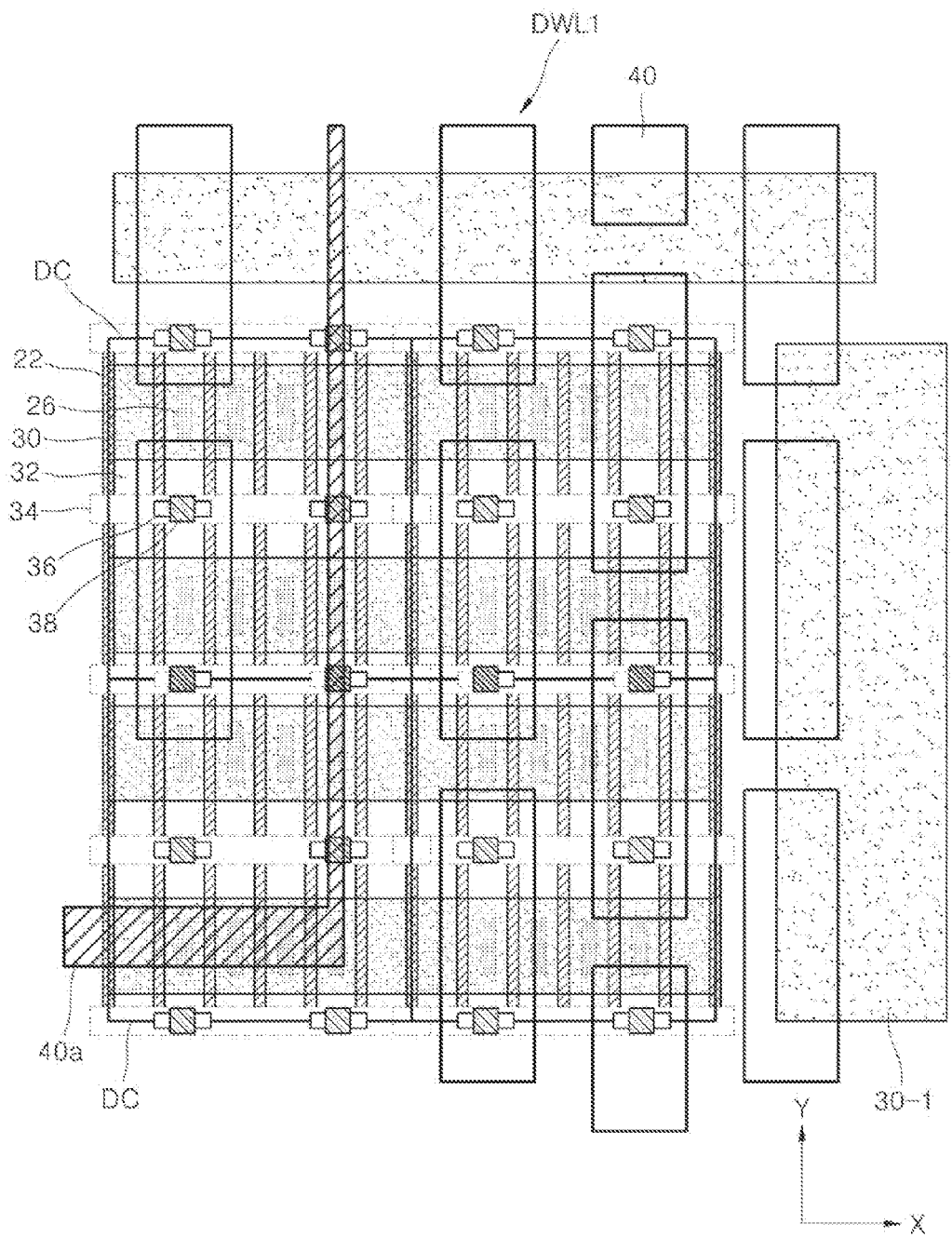
FIG. 10 is a layout diagram of elements of a semiconductor device including a dummy cell array, according to an embodiment of the inventive concept.

FIG. 10 is a layout diagram of elements of a semiconductor device including a dummy cell array, according to an embodiment of the inventive concept.

In detail, the layout diagram of the main parts of the semiconductor device may have the same configuration and effects as FIG. 2, except that the device of FIG. 10 includes an active pattern 30-1 and a first wiring line 40*a* of a cell, i.e., an active cell, in addition to the dummy cell array of FIG. 2.

As shown in FIG. 10, the first wiring line 40*a* of the cell may be arranged inside the dummy cell array. The active pattern 30-1 of the cell may be arranged outside the dummy cell array. As described above, the dummy cell array and a cell array are not clearly distinguished, and on a substrate on which devices are formed, the dummy cell array and the cell array may be mixedly implemented.

Figure 11:
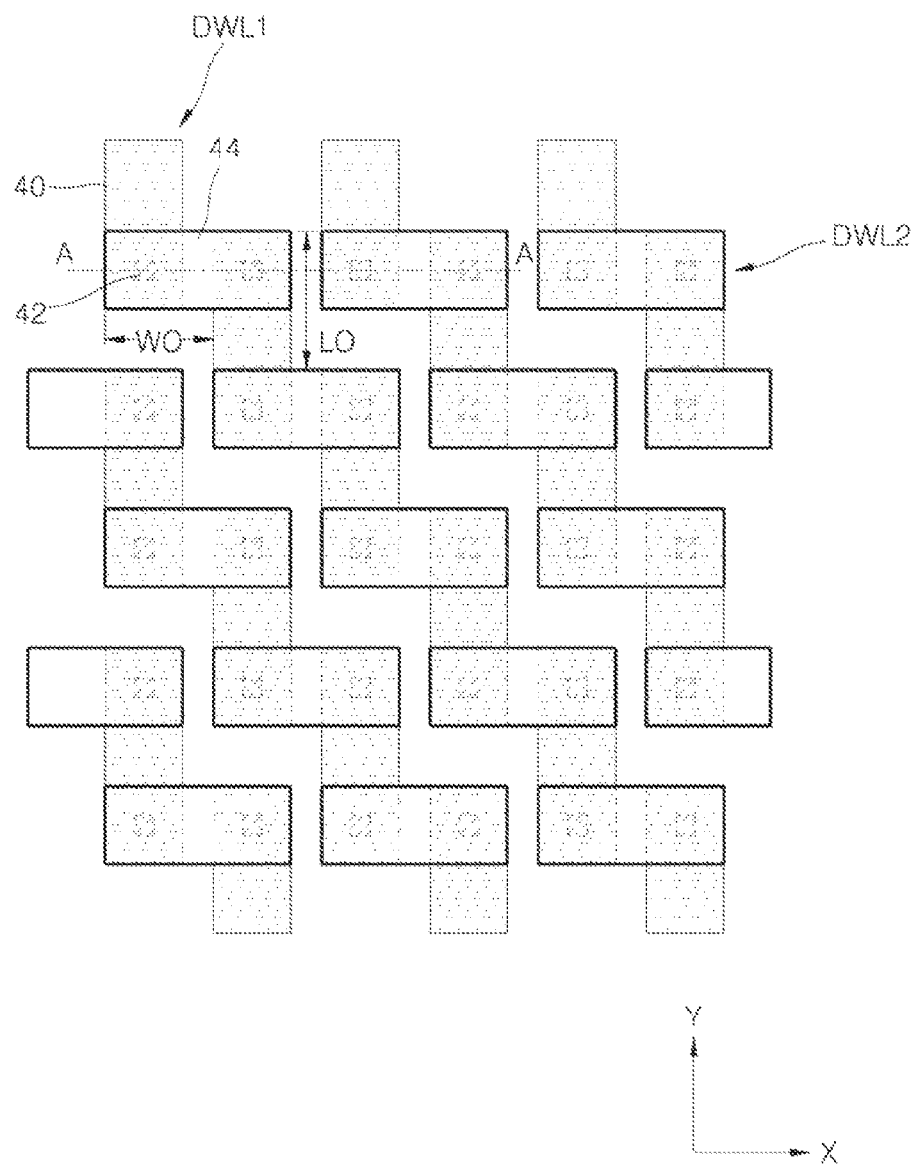
FIG. 11 is a layout diagram of elements of a semiconductor device including a dummy cell array, according to another embodiment of the inventive concept.
Figure 12:
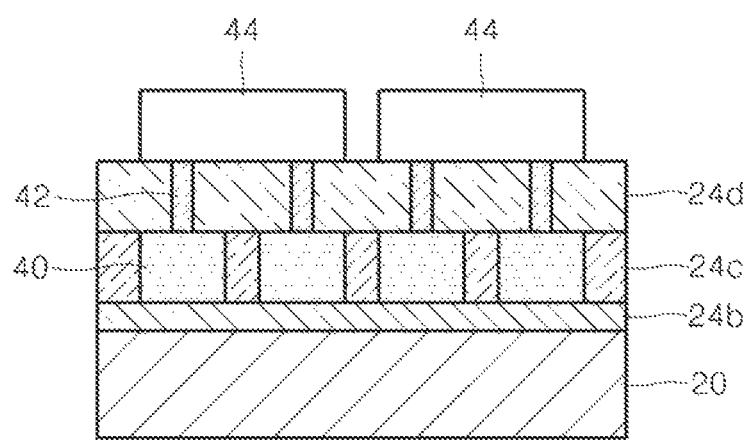
FIG. 12 is a cross-sectional view along line A-A of FIG. 11.

FIG. 11 is a layout diagram of elements of a semiconductor device including a dummy cell array, according to another embodiment of the inventive concept. FIG. 12 is a cross-sectional view along line A-A of FIG. 11.

In detail, the dummy cell array of FIG. 11 illustrates that a plurality of second dummy vias 42 and a plurality of second dummy wiring lines (DWL2s) 44 are implemented on the plurality of DWL1s 40 as described above. As shown in FIG. 12, a second interlayer insulating layer 24*b* may be formed on the substrate 20. The plurality of DWL1s 40 are insulated from each other by a third interlayer insulating layer 24*c*, and may be formed on the second interlayer insulating layer 24*b*.

As shown in FIG. 11, the plurality of DWL1s 40 may be arranged in parallel to each other along the first direction, i.e., the X-axis direction, and may extend in the second direction that is orthogonal to the first direction. The second direction may be a high-priority arrangement direction of the plurality of DWL1s 40. The plurality of second dummy vias 42 may be formed on the plurality of DWL1s 40. The plurality of second dummy vias 42 may be insulated from each other by a fourth interlayer insulating layer 24*d*.

The plurality of DWL2s 44 may be formed on the plurality of second dummy vias 42. The plurality of DWL2s 44 may be connected to the plurality of second dummy vias 42. The plurality of second dummy vias 42 may be arranged in a region where the plurality of DWL1s 40 overlap the plurality of DWL2s 44.

As shown in FIG. 11, the plurality of DWL2s 44 may be arranged in parallel to each other along the second direction, i.e., the Y-axis direction, and arranged to extend in the first direction. The first direction, i.e., the X-axis direction, may be a high-priority arrangement direction of the plurality of DWL2s 44. The high-priority arrangement directions of the plurality of DWL1s 40 and the plurality of DWL2s 44 may be orthogonal to each other.

As described above, in the dummy cell array according to the present embodiment, the plurality of second dummy vias 42 may be aligned with the plurality of DWL2s 44, as described above with respect to the plurality of DWL1s 40.

Figure 13:
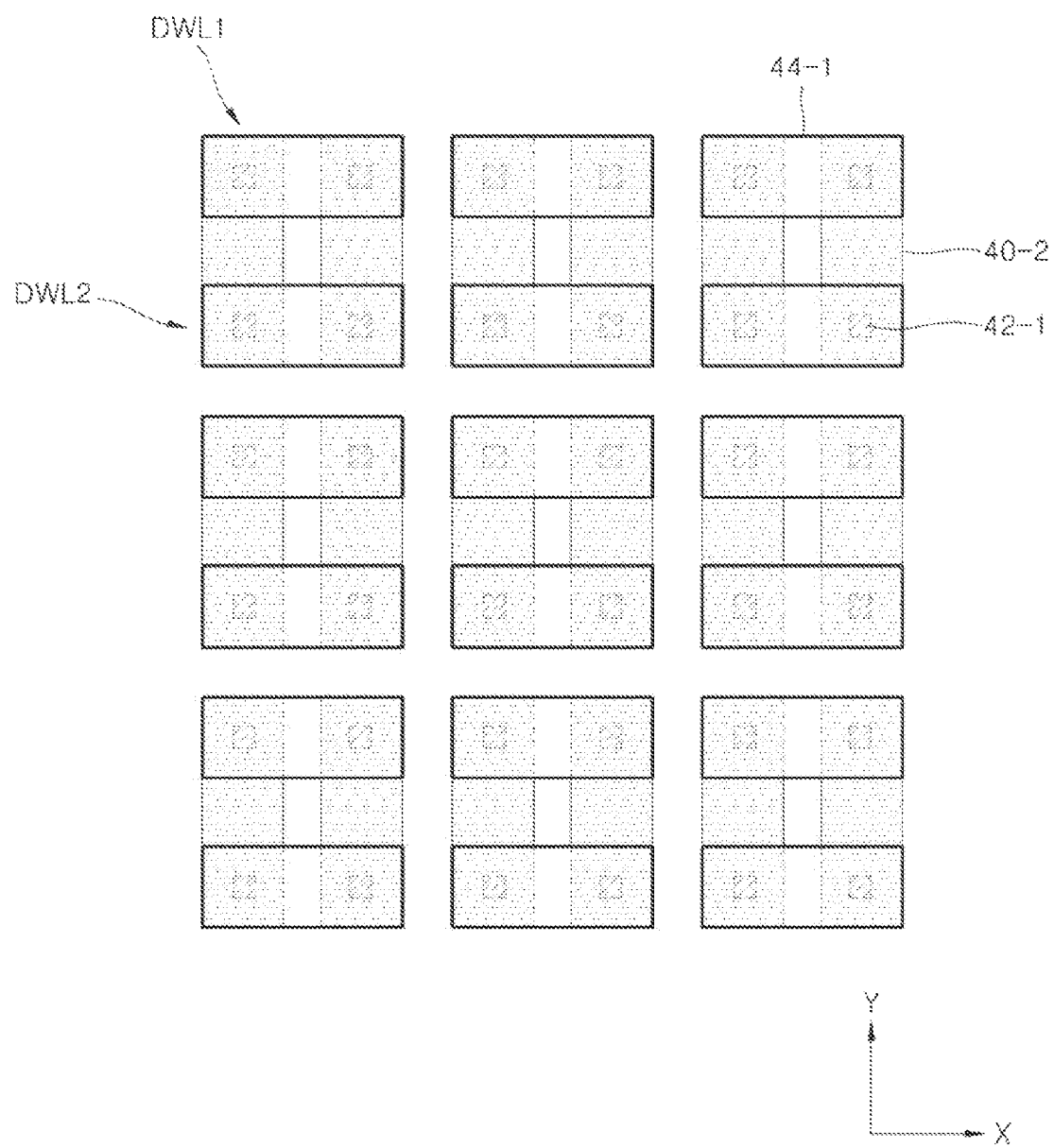
FIG. 13 is a layout diagram of elements of a dummy cell array in a semiconductor device, according to another embodiment of the inventive concept.

FIG. 13 is a layout diagram of elements of a dummy cell array in a semiconductor device, according to another embodiment of the inventive concept.

In detail, the dummy cell array of FIG. 13 illustrates that a plurality of second dummy vias 42-1 and a plurality of second dummy wiring lines (DWL2s) 44-1 are implemented on the plurality of DWL1s 40-2 as described above. The dummy cell array of FIG. 13 may have the same configuration and effects as the dummy cell array of FIG. 2, except for an arrangement relationship of the plurality of DWL1s 40-2 and the DWL2s 44-1.

Compared with the plurality of DWL1s 40 of FIG. 11, the plurality of DWL1s 40-2 have an offset (LO of FIG. 11) along the Y-axis of the plurality of first dummy wiring patterns 40-2 which is zero (0). Accordingly, with no offset, the plurality of DWL1s 40-2 may be aligned with each other along the first direction (X-axis direction).

Compared with the plurality of DWL2s 44 of FIG. 11, the plurality of DWL2s 44-1 have the offset along the X-axis (WO of FIG. 11) of the plurality of second dummy wiring patterns 44-1 which is zero (0). Accordingly, with no offset, the plurality of DWL2s 44-1 may be aligned with each other along the second direction (Y-axis direction).

Referring to FIG. 13, the plurality of second dummy vias 42-1 may be arranged in a region where the plurality of DWL1s 40-2 overlap the plurality of DWL2s 44-1. As described above, the plurality of DWL1 s 40-2 and the plurality of DWL2s 44-1 may be arranged in various manners while covering the plurality of second dummy vias 42-1 on the plurality of DWL1s 40-2.

Figure 14:
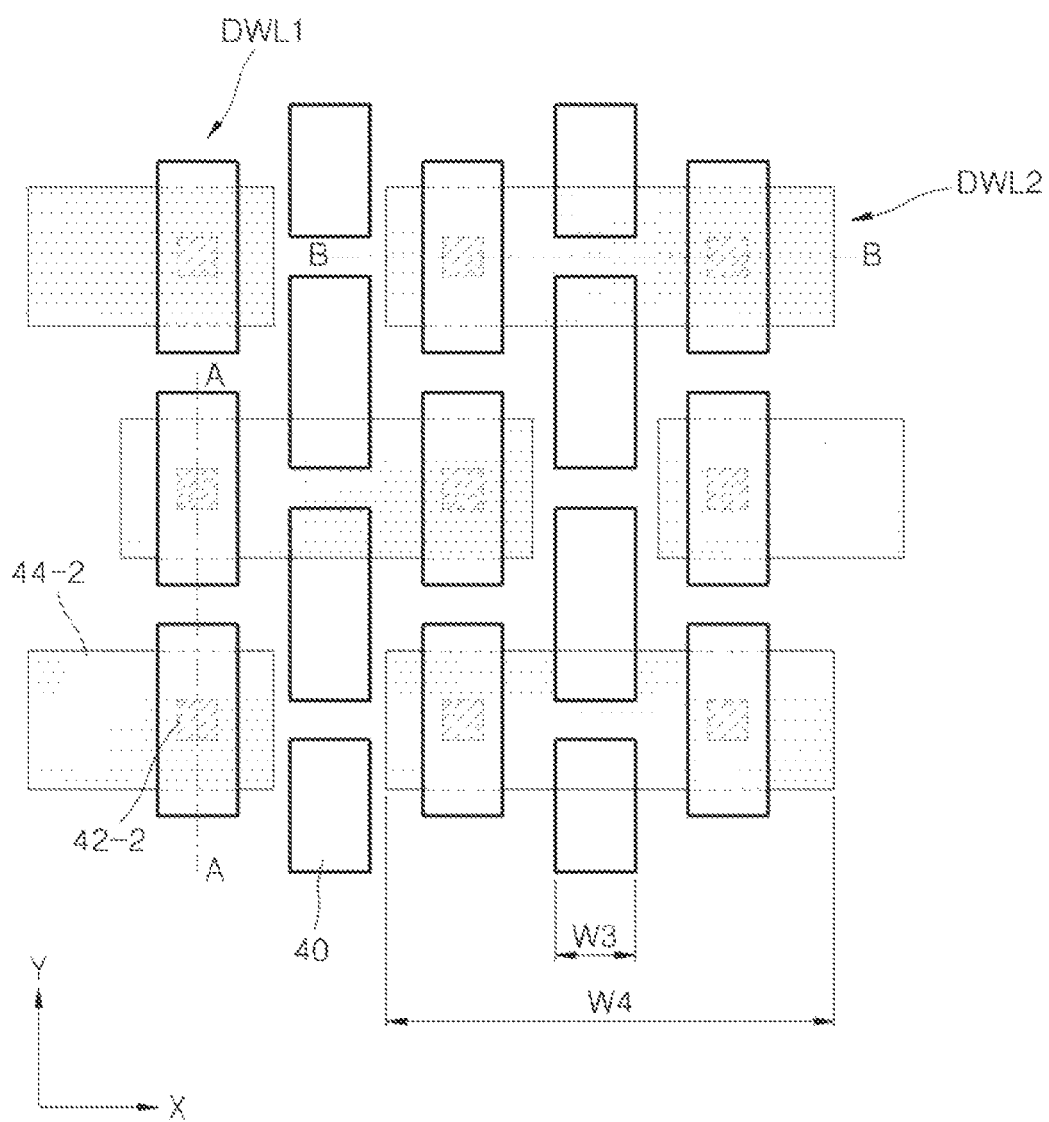
FIG. 14 is a layout diagram of elements of a semiconductor device including a dummy cell array, according to another embodiment of the inventive concept.
Figure 15:
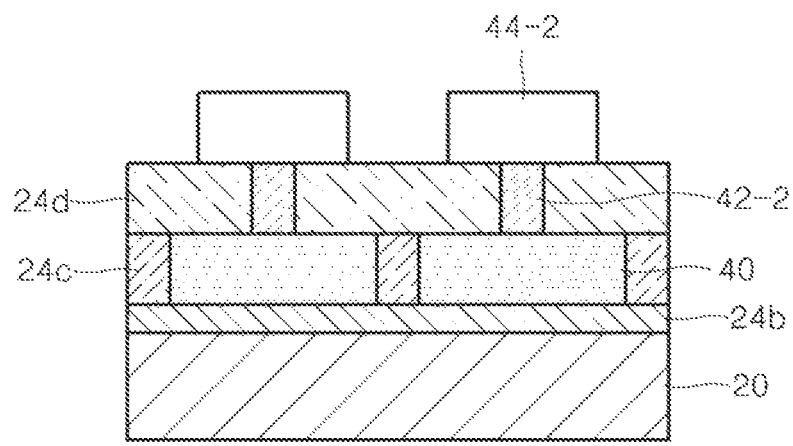
FIGS. 15 and 16 are cross-sectional views along lines A-A and B-B of FIG. 14, respectively.
Figure 16:
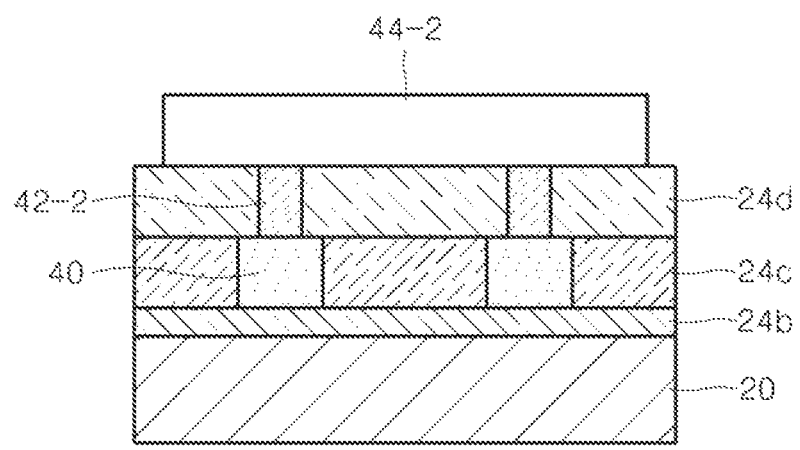

FIG. 14 is a layout diagram of elements of a semiconductor device including a dummy cell array, according to another embodiment of the inventive concept. FIGS. 15 and 16 are cross-sectional views along lines A-A and B-B of FIG. 14.

In detail, the dummy cell array of FIG. 14 illustrates that a plurality of second dummy vias 42-2 and a plurality of second dummy wiring lines (DWL2s) 44-2 are implemented on the plurality of DWL1s 40. As shown in FIG. 15, the second interlayer insulating layer 24*b* may be formed on the substrate 20. The plurality of DWL1s 40 may be insulated from each other by the third interlayer insulating layer 24*c*, and formed on the second interlayer insulating layer 24*b*.

As shown in FIG. 15, the plurality of DWL1s 40 may be arranged in parallel to each other along the first direction, i.e., the X-axis direction, and extend in the second direction that is orthogonal to the first direction. The second direction may be a high-priority arrangement direction of the plurality of DWL1s 40. The plurality of second dummy vias 42-2 may be formed on the plurality of DWL1s 40. The plurality of second dummy vias 42-2 may be insulated from each other by the fourth interlayer insulating layer 24*d*.

The plurality of DWL2s 44-2 may be formed on the plurality of second dummy vias 42-2. The plurality of DWL2s 44-2 may be connected to the plurality of second dummy vias 42-2. The plurality of second dummy vias 42-2 may be arranged in a region where the plurality of DWL1s 40 overlap the plurality of DWL2s 44-2.

As shown in FIG. 14, the plurality of DWL2s 44-2 may be arranged in parallel to each other along the second direction, i.e., the Y-axis direction, and arranged to extend in the first direction. The first direction may be a high-priority arrangement direction of the plurality of DWL2s 44-2. The high-priority arrangement directions of the plurality of DWL1s 40 and the plurality of DWL2s 44-2 may be orthogonal to each other.

As shown in FIG. 14, a width W4 extending in the first direction of the plurality of DWL2s 44-2 may be about n times a width W3 extending in the first direction of the plurality of DWL1s 40 (n is a natural number). For example, in FIG. 15, the width W4 in the first direction of the plurality of DWL2s 44-2 may be about six times the width W3 in the first direction of the plurality of DWL1s 40. As described above, in the dummy cell array according to the present embodiment, the plurality of second dummy vias 42-2 may be aligned with the plurality of DWL2s 44-2 as described above with respect to the plurality of DWL1s 40.

Figure 17:
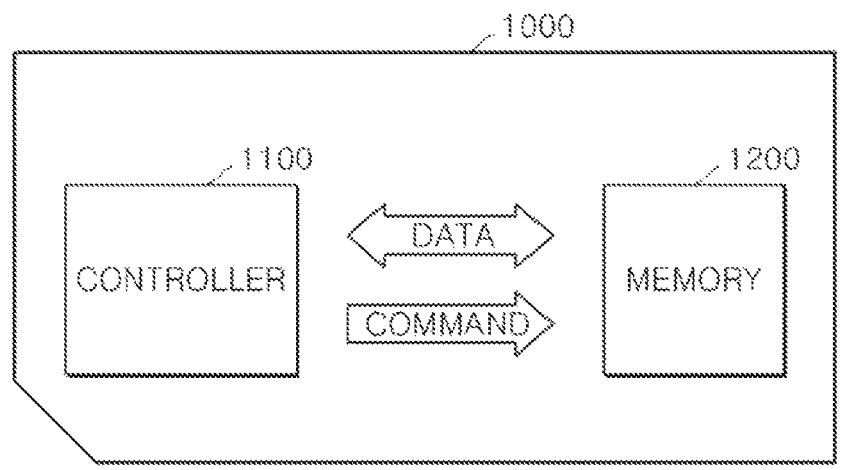
FIG. 17 is a block diagram of a memory card including a semiconductor device, according to an embodiment of the inventive concept.

FIG. 17 is a block diagram of a memory card 1000 including a semiconductor device, according to an embodiment of the inventive concept.

The memory card 1000 may be arranged so that a controller 1100 and a memory 1200 electrically communication, and therefore may exchange electrical signals. For example, when the controller 1100 transmits a command, the memory 1200 may transmit data.

The controller 1100 and the memory 1200 may include a semiconductor device according to an embodiment of the inventive concept. In particular, the controller 1100 and the memory 1200 may include one or more semiconductor devices according to the above-described embodiments of the inventive concept.

The memory card 1000 may include various types of memory cards, e.g., a memory stick card, a smart media (SM) card, a secure digital (SD) card, a mini-SD card, a multimedia card (MMC), and the like.

Figure 18:
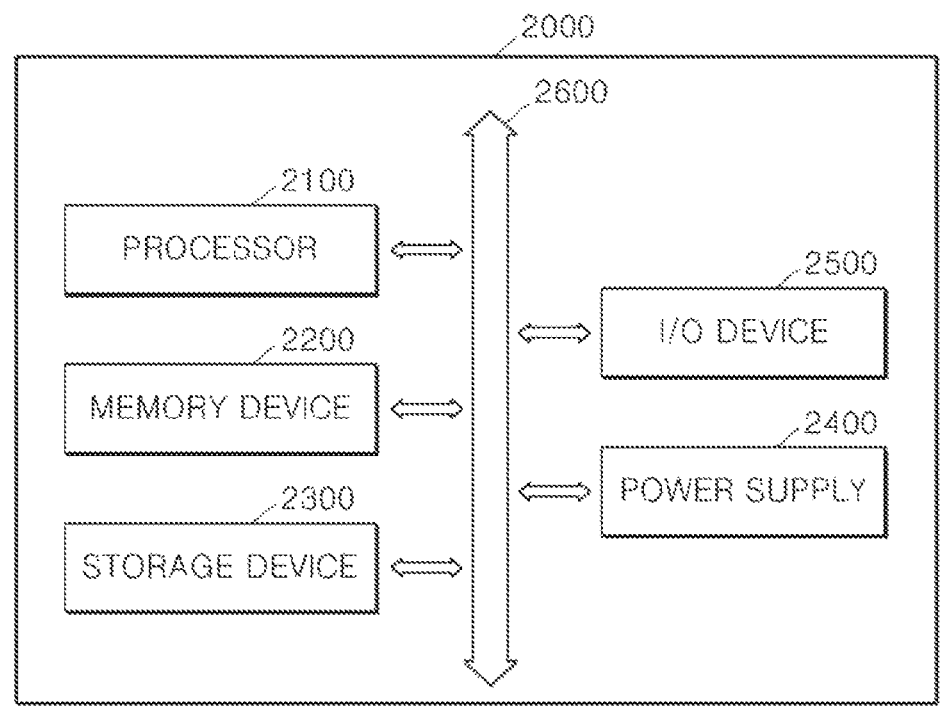
FIG. 18 is a block diagram of a computing system including a semiconductor device, according to an embodiment of the inventive concept.

FIG. 18 is a block diagram of a computing system 2000 including a semiconductor device, according to an embodiment of the inventive concept.

In detail, the computing system 2000 may include a processor 2100, a memory device 2200, a storage device 2300, a power supply 2400, and an I/O device 2500. Although not shown in FIG. 18, the computing system 2000 may further include input/output (I/O) ports constructed and arranged to communicate with devices including but not limited to a video card, a sound card, a memory card, a universal serial bus (USB) device, and the like or other electronic devices.

As described above, the processor 2100, the memory device 2200, the storage device 2300, the power supply 2400, and the I/O device 2500 included in the computing system 2000 may include semiconductor integrated circuits according to embodiments of the inventive concept. In particular, the processor 2100, the memory device 2200, the storage device 2300, the power supply 2400, and the I/O device 2500 included in the computing system 2000 may include semiconductor devices according to the above-described embodiments of the inventive concept.

The processor 2100 may perform specific computations or tasks. According to embodiments, the processor 2100 may be a microprocessor or a central processing unit (CPU). The processor 2100 may communicate with the memory device 2200, the storage device 2300, and the I/O device 2500 through a bus 2600 including an address bus, a control bus, a data bus, and the like. According to some embodiments, the processor 2100 may be connected to an extension bus, such as a peripheral component interconnect (PCI) bus, for communicating with the other elements such as the storage device 2300, etc.

The memory device 2200 may store data required for an operation of the computing system 2000. For example, the memory device 2200 may be implemented with dynamic random access memory (DRAM), mobile DRAM, static RAM (SRAM), programmable RAM (PRAM), ferroelectric RAM (FRAM), resistive RAM (RRAM) and/or magnetoresistive RAM (MRAM). The storage device 2300 may include but not be limited to a solid state drive, a hard disk drive, compact disc read only memory (CD-ROM), and the like.

The I/O device 2500 may include an input means, such as a keyboard, a keypad, a mouse, and the like, and an output means, such as a printer, a display, and the like. The power supply 2400 may supply operation power required for an operation of the computing system 2000.

The semiconductor device according to one or more embodiments of the inventive concept may be implemented by various forms of packages. For example, at least some components of a semiconductor integrated circuit may be mounted using packages, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi-chip package (MCP), wafer-level fabricated package (WFP), wafer-level processed stack package (WSP), and the like.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
a plurality of dummy gate lines parallel to each other in a first direction and extending in a second direction that is orthogonal to the first direction;
a plurality of first dummy filling patterns between the plurality of dummy gate lines, the first dummy filling patterns parallel to each other in the first direction, and arranged apart from each other in the second direction, the first dummy filling patterns separate from the dummy gate lines;
an interlayer insulating layer that insulates the first dummy filling patterns from each other, the first dummy filling patterns formed in the interlayer insulating layer;
a plurality of first dummy vias on the plurality of first dummy filling patterns; and
a plurality of first dummy wiring lines connected to the first dummy filling patterns through the plurality of first dummy vias, the first dummy wiring lines extending in the second direction, and parallel to each other in the first direction,
wherein a center line of each of the plurality of first dummy filling patterns extends along the second direction, and aligns with a center line of a corresponding first dummy wiring line of the plurality of first dummy wiring lines so that the plurality of first dummy filling patterns are constructed, arranged, and aligned with the plurality of first dummy wiring lines extending along the second direction.

2. The semiconductor device of claim 1, wherein the plurality of first dummy vias are arranged at the centers of the plurality of first dummy filling patterns, respectively, and are spaced apart from the plurality of dummy gate lines.

3. The semiconductor device of claim 1, further comprising a plurality of dummy gate separation lines that intersect the plurality of dummy gate lines along the first direction and are arranged in parallel to each other along the second direction.

4. The semiconductor device of claim 3, wherein the plurality of first dummy filling patterns are arranged within a perimeters of, and at center portions of, the dummy gate separation lines, and wherein the perimeters of the dummy gate separation lines are between the first dummy filling patterns and the dummy gate lines such that the first dummy filling patterns are not connected to the plurality of dummy gate lines.

5. The semiconductor device of claim 1, further comprising a plurality of dummy active patterns crossing the plurality of dummy gate lines along the first direction and arranged in parallel to each other and apart from the plurality of first dummy filling patterns along the second direction.

6. The semiconductor device of claim 5, wherein a pitch of the plurality of first dummy filling patterns along the second direction is the same as a pitch of the plurality of dummy active patterns.

7. The semiconductor device of claim 5, wherein a plurality of second dummy filling patterns are arranged between the plurality of dummy gate lines in the plurality of dummy active patterns.

8. The semiconductor device of claim 1, wherein each of the plurality of first dummy wiring lines is along the second direction and formed as a plurality of first dummy wiring patterns.

9. The semiconductor device of claim 8, wherein each of the plurality of first dummy wiring patterns is connected to the plurality of first dummy vias along the second direction.

10. The semiconductor device of claim 1, further comprising:
a plurality of second dummy vias arranged on the plurality of first dummy wiring lines; and
a plurality of second dummy wiring lines are connected to the plurality of second dummy vias, extend along the first direction, and are arranged in parallel to each other along the second direction.

11. The semiconductor device of claim 10, wherein each of the plurality of second dummy wiring lines is along the first direction and formed as a plurality of second dummy wiring patterns, and each of the plurality of second dummy wiring patterns is connected to a plurality of second dummy vias.

12. The semiconductor device of claim 10, wherein each of the plurality of first dummy wiring lines is along the second direction and formed as a plurality of first dummy wiring patterns, and a width of the plurality of second dummy wiring patterns along the first direction is about n times of a width of the plurality of first dummy wiring patterns (n is a natural number).

13. A dummy cell of a semiconductor device, comprising:
a plurality of dummy gate lines parallel to each other in a first direction and extending in a second direction that is orthogonal to the first direction;
a first interlayer insulating pattern that insulates the dummy gate lines from each other;
a first dummy filling pattern between the dummy gate lines, the first dummy filling pattern formed in the first interlayer insulating pattern;
a second interlayer insulating layer on the first interlayer insulating layer;
a dummy via extending through and insulated by the second interlayer insulating layer; and
a dummy wiring line on the dummy via, the dummy wiring line and the dummy via aligned with each other along the second direction.

14. The dummy cell of claim 13, further comprising dummy gate separation lines intersecting the plurality of dummy gate lines along the first direction and arranged in parallel to each other along the second direction.

15. The dummy cell of claim 13, wherein a center line of the first dummy filling pattern extends along the second direction, and aligns with a center line of the dummy wiring line.

16. The dummy cell of claim 13, further comprising a dummy active pattern crossing the plurality of dummy gate lines along the first direction and apart from the first dummy filling pattern along the second direction.

17. The dummy cell of claim 16, wherein a second dummy filling pattern is between the plurality of dummy gate lines in the dummy active pattern.

18. A semiconductor device comprising:
a plurality of dummy gate lines parallel to each other in a first direction and extending in a second direction that is orthogonal to the first direction;
a plurality of first dummy filling patterns between the plurality of dummy gate lines, the first dummy filling patterns parallel to each other in the first direction, and arranged apart from each other in the second direction, the first dummy filling patterns separate from the dummy gate lines;
an interlayer insulating layer that insulates the first dummy filling patterns from each other, the first dummy filling patterns formed in the interlayer insulating layer;
a plurality of first dummy vias on the plurality of first dummy filling patterns;
a plurality of first dummy wiring lines connected to the first dummy filling patterns through the plurality of first dummy vias, the first dummy wiring lines extending in the second direction, and parallel to each other in the first direction;
a plurality of second dummy vias arranged on the plurality of first dummy wiring lines; and
a plurality of second dummy wiring lines connected to the plurality of second dummy vias, extend along the first direction, and arranged in parallel to each other along the second direction.

19. The semiconductor device of claim 18, wherein each of the plurality of second dummy wiring lines is along the first direction and formed as a plurality of second dummy wiring patterns, and each of the plurality of second dummy wiring patterns is connected to a plurality of second dummy vias.

20. The semiconductor device of claim 18, wherein each of the plurality of first dummy wiring lines is along the second direction and formed as a plurality of first dummy wiring patterns, and a width of the plurality of second dummy wiring patterns along the first direction is about n times of a width of the plurality of first dummy wiring patterns (n is a natural number).

* * * * *